(12) United States Patent
Seidel et al.

(10) Patent No.: US 9,065,240 B2
(45) Date of Patent: Jun. 23, 2015

(54) ACTUATION DEVICE FOR A LASER DIODE, LASER PROJECTION SYSTEM AND METHOD FOR SPECKLE REDUCTION IN A LASER DIODE

(71) Applicants: Juergen Seidel, Baltmannsweiler (DE); Reinhold Fiess, Durbach (DE); Juergen Hasch, Stuttgart (DE); Annette Frederiksen, Renningen (DE)

(72) Inventors: Juergen Seidel, Baltmannsweiler (DE); Reinhold Fiess, Durbach (DE); Juergen Hasch, Stuttgart (DE); Annette Frederiksen, Renningen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/376,345

(22) PCT Filed: Jan. 25, 2013

(86) PCT No.: PCT/EP2013/051395
§ 371 (c)(1),
(2) Date: Aug. 1, 2014

(87) PCT Pub. No.: WO2013/113621
PCT Pub. Date: Aug. 8, 2013

(65) Prior Publication Data
US 2015/0110139 A1  Apr. 23, 2015

(30) Foreign Application Priority Data
Feb. 2, 2012  (DE) .......................... 10 2012 201 492

(51) Int. Cl.
*H01S 3/00* (2006.01)
*H01S 5/042* (2006.01)
*H01S 5/068* (2006.01)
*H01S 5/0683* (2006.01)
*H01S 3/13* (2006.01)

(52) U.S. Cl.
CPC ........... *H01S 5/0427* (2013.01); *H01S 5/06817* (2013.01); *H01S 5/06808* (2013.01); *H01S 5/06832* (2013.01); *H01S 5/0683* (2013.01); *H01S 5/068* (2013.01); *H01S 3/1305* (2013.01)

(58) Field of Classification Search
CPC ............ H01S 5/06817; H01S 5/06808; H01S 5/06832; H01S 5/0683; H01S 5/068; H01S 3/1305
USPC .................. 372/38.08, 38.07, 29.014, 29.015, 372/29.011
See application file for complete search history.

(56) References Cited

U.S. PATENT DOCUMENTS

| 6,600,590 | B2 * | 7/2003 | Roddy et al. ................... 359/287 |
| 2002/0114057 | A1 * | 8/2002 | Roddy et al. ................... 359/278 |
| 2006/0215716 | A1 * | 9/2006 | Luo et al. ................... 372/38.08 |
| 2009/0067459 | A1 * | 3/2009 | Mizuuchi et al. ................ 372/25 |
| 2010/0103379 | A1 * | 4/2010 | Fiess ................................. 353/7 |

FOREIGN PATENT DOCUMENTS

| DE | 10 2008 043153 | 4/2010 |
| DE | 10 2011 005576 | 9/2012 |

OTHER PUBLICATIONS

International Search Report for PCT/EP2013/051395, dated Jun. 20, 2013.

\* cited by examiner

*Primary Examiner* — Kinam Park
(74) *Attorney, Agent, or Firm* — Kenyon & Kenyon LLP

(57) ABSTRACT

An actuation device for a laser diode includes: a first driver device which is set up to generate a high-frequency modulated actuation signal and to feed the signal into the laser diode for speckle suppression, and an evaluation circuit, which is coupled with the first driver device, and which is set up to output to the first driver device an intensity signal indicating the intensity of the light emitted by the laser diode and a control signal as a function of the intensity signal in order to regulate the high-frequency modulated actuation signal.

7 Claims, 2 Drawing Sheets

ACTUATION DEVICE FOR A LASER DIODE, LASER PROJECTION SYSTEM AND METHOD FOR SPECKLE REDUCTION IN A LASER DIODE

BACKGROUND OF THE INVENTION

1. Field of the Invention

The present invention relates to an actuation device for a laser diode, a laser projection system and a method for speckle reduction in a laser diode.

2. Description of the Related Art

Laser projection systems use semiconductor lasers, so-called laser diodes, to project images, graphics or videos onto a projection surface. For this purpose, an appropriately modulated data signal may be applied to the laser diodes for converting the image, graphic or video data into mechanical movements of the laser projection system.

Laser diodes generate structured patterns of different brightness in a viewer's eye when coherent light impinges on an optically rough surface, when it is reflected or scattered from there and the wave fronts reflected into different directions interfere with one another. This phenomenon is also known as "speckle." Speckle patterns adversely affect the optical impression of the projected image data, so that it is generally desirable to suppress or reduce the appearance of speckles when using laser diodes.

U.S. Pat. No. 6,600,590 B2 describes a laser projection system having a semiconductor laser, which is operated by a high frequency signal in a multi-mode operation to reduce speckles. Via a photo diode, the power of the light emitted by the semiconductor laser is detected and a constant component of the high-frequency signal of the semiconductor laser is regulated as a function of the detected power to keep the emissivity of the semiconductor laser constant.

There exists a need to regulate the speckle suppression in laser projection systems, in particular in systems having laser diodes.

BRIEF SUMMARY OF THE INVENTION

According to one aspect, the present invention provides an actuation device, having a first driver device, which is set up to generate a high-frequency modulated actuation signal and to feed the signal into the laser diode for speckle suppression, and having an evaluation circuit, which is coupled with the first driver device, and which is set up to output an intensity signal, indicating the intensity of the light emitted by the laser diode, and, depending on the intensity signal, to output a control signal to the first driver device for regulating the high-frequency modulated actuation signal.

According to another aspect, the present invention provides a laser projection system having a laser diode for projecting image data, a photo diode, which is set up to detect the intensity of the light emitted by the laser diode and to output an intensity signal, and an actuation device according to the present invention, which is set up to actuate the laser diode.

According to another aspect, the present invention provides an electronic application device having a laser projection system according to the present invention.

According to another aspect, the present invention provides a method for speckle reduction in a laser diode, including the steps of generating a high-frequency modulated actuation signal, operating the laser diode using the high-frequency modulated actuation signal for speckle reduction, detecting the intensity of the light emitted by the laser diode in a photo diode, and, regulating the high-frequency modulated actuation signal for adjusting the degree of speckle reduction as a function of the detected intensity.

An idea of the present invention is to regulate the speckle suppression in a laser diode during its operation. For this purpose, a high-frequency modulated actuation signal of the laser diode, which suppresses the appearance of speckle patterns in the radiated light of the laser diode, is regulated using the power emitted by the laser diode and the modulation depth of the emitted image signal as a control variable. In doing so, the extent of the speckle reduction may be adjusted to a desired setpoint while operating the laser diode.

One advantage of the present invention is that the speckle reduction may be regulated independently of production variances and/or production-related performance factors of the actuated laser diode. In particular, it is not necessary to adjust the high-frequency modulated actuation signal manually as a function of production or operation parameters of the laser diode.

A further advantage of the present invention is that the extent of the speckle suppression may be selectively adjusted. This may be advantageous because the adverse impact on the visual effect of a laser-projected image under the influence of speckles depends on the type of projected information. Depending on the projected data type, for example, still image, moving graphics, presentation, text display, video or film, the degree of speckle reduction may be adjusted to the data type.

Furthermore, it is advantageous that the speckle suppression may be adjusted as a function of the emitted brightness of the laser diode. Especially when the overall brightness is low, the speckle reduction may be reduced in order to prevent the brightness of the projected image from becoming too low.

According to one embodiment, the evaluation circuit may be set up to receive a setpoint signal for the degree of speckle suppression in the laser diode and to generate the control signal as a function of the setpoint signal. This offers the advantage of allowing for an adaptive adjustment of the degree of speckle reduction, for example, an application-specific adjustment or an adjustment as a function of external parameters such as ambient brightness.

According to a further embodiment, the actuation device may have a second driver device, which is set up to receive an image data signal containing image data to be projected by the laser diode, and to generate a data control signal for actuating the laser diode as a function of the image data signal.

Preferably, the evaluation circuit may be set up to evaluate the intensity signal in order to determine a ratio between the intensity resulting from the high-frequency modulated actuation signal and the intensity of the light emitted by the laser diode, resulting from the data control signal. Therefore, a closed loop control may advantageously include the image data modulation depth, that is, it may take into account the image data presently projected by the laser diode when adjusting the speckle reduction.

According to a further embodiment, the laser projection system may be integrated in a laptop, a smart phone, a mobile phone, a motor vehicle display unit or an image projector. This offers wide-ranging application possibilities for a low-speckle projection of image data using a laser diode.

Additional features and advantages of specific embodiments of the present invention follow from the subsequent description with reference to the appended drawing.

The elements of the drawing are not necessarily shown true to scale in relation to one another.

DETAILED DESCRIPTION OF THE INVENTION

Figure 1:
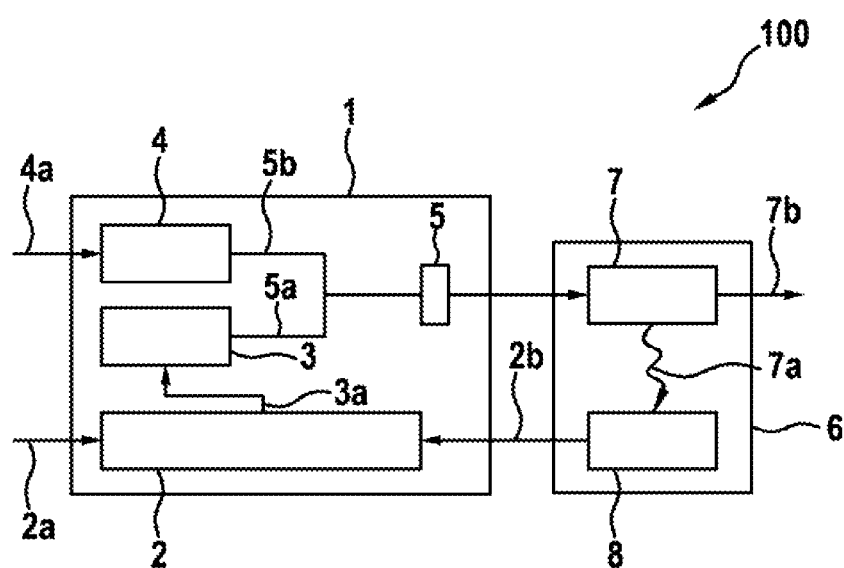
FIG. 1 shows a schematic representation of a laser projection system according to one specific embodiment.

FIG. 1 shows a schematic representation of a laser projection system 100. Laser projection system 100 includes an actuation device 1 and a projection apparatus 6. Projection apparatus 6, for example, may include a casing, in which one or more laser diodes 7 is/are situated. For purposes of clarity, FIG. 1 shows only one laser diode. It is also possible, however, that more than one laser diode is situated in projection apparatus 6. Furthermore, projection apparatus 6 may have additional, not explicitly shown components, such as imaging optics, mirrors, diaphragms, motors and similar devices, which are suitable for enabling laser diode 7 to project image data.

Projection apparatus 6 furthermore may have a photo diode 8 or also a monitor diode, by which the intensity 7a or brightness of the light emitted from laser diode 7 may be detected in a time-resolved manner. To this end, photo diode 8, for example, may detect a fraction of the total laser light 7b emitted by laser diode 7.

Actuation device 1 may be equipped with an evaluation circuit 2, set up to receive an intensity signal 2b from photo diode 8, which indicates the level of instantaneous intensity 7a of the laser light emitted by laser diode 7. Furthermore, the actuation device 1 may have a first driver device 3 that is set up to generate a high-frequency modulated actuation signal 5a, which may be fed into laser diode 7 for speckle suppression. The high-frequency modulated actuation signal 5a is able to be modulated, for instance, in such a manner that different oscillating modes of laser diode 7 are excited simultaneously or one after the other in short succession, so that the emitted light generates different speckle patterns, which cancel one another or delete one another at least partially at the location of the viewer of the image data projected from laser diode 7. In this way, a speckle reduction in laser diode 7 may be achieved.

Furthermore, actuation device 1 may have a second driver device 4, which is set up to receive an image signal 4a, containing image data to be projected by laser diode 7, and to generate a data control signal 5b for actuating laser diode 7 as a function of image data signal 4a. For example, image data signal 4a may have information about the data to be projected, such as a still image signal, a graphics signal, a video signal, a film signal or the like. Second driver device 4 is able to generate data control signal 5b according to the production technology used in projection apparatus 6, that is, to convert image data signal 4a, for example, into a control signal for the line-by-line scanning of the projection surface by laser beam 7b emitted by laser diode 7. Of course, it is also possible to use any other projection technology for generating data control signal 5b with the aid of second driver device 4. It is also possible that an external processor, for example, a processor of an electronic application device, which utilizes laser projection system 100, generates data control signal 5b.

The control signals 5a and 5b, for example, may be combined in a control device 5 into one joint control signal for laser diode 7.

By actuating laser diode 7 through the first driver device 3 and, where applicable, through the second driver device 4, the light 7b, emitted by laser diode 7, has an unmodulated and a modulated component. The modulated component may then in turn be composed of a first component, which results from high-frequency modulated actuation signal 5a, and a second component, which results from data control signal 5b. Therefore, intensity signal 2b, output by photo diode 8, also has the respective intensity modulation of the light emitted by laser diode 7. Thus, intensity signal 2b may be evaluated in evaluation circuit 2 with regard to these modulated components. In doing so, a ratio, for example, may be determined between the modulated and the unmodulated component and/or between the intensity resulting from high-frequency modulated actuation signal 5a and the intensity of the light emitted by laser diode 7, resulting from data control signal 5b. These ratios provide information, individually or when suitably combined, about the degree of speckle reduction by actuation signal 5a. Depending on that degree, evaluation circuit 2 is able to output a control signal 3a to the first driver device 2 for regulating actuation signal 5a.

For example, evaluation circuit 2 may receive a setpoint signal 2a for the degree of speckle suppression in laser diode 7, and generate control signal 3a as a function of setpoint signal 2a. Setpoint signal 2a, for example, may feature a variable for the desired degree of speckle reduction, which the user of laser projection system 100 is able to adjust. It is, however, also possible that setpoint signal 2a is automatically adjusted as a function of various parameters. Setpoint signal 2a, for example, is adjustable as a function of the type of projected image data. For example, when projecting moving images, such as a video game or a film, the degree of the speckle reduction may be adjusted to a lower setpoint than when projecting still images or presentation graphics, because speckle patterns are usually perceived as less disturbing in moving images. It is also possible to adjust setpoint signal 2a as a function of the ambient brightness. For example, at high ambient light, the degree of speckle reduction may be reduced to achieve a higher brightness when projecting image data through laser diode 7.

Evaluation circuit 2 may also be set up in driver device 3. It is also possible that a superposed control, such as a processor or a processing unit of an electronic application device that utilizes laser projection system 100, assumes the functionality of evaluation circuit 2.

Figure 2:
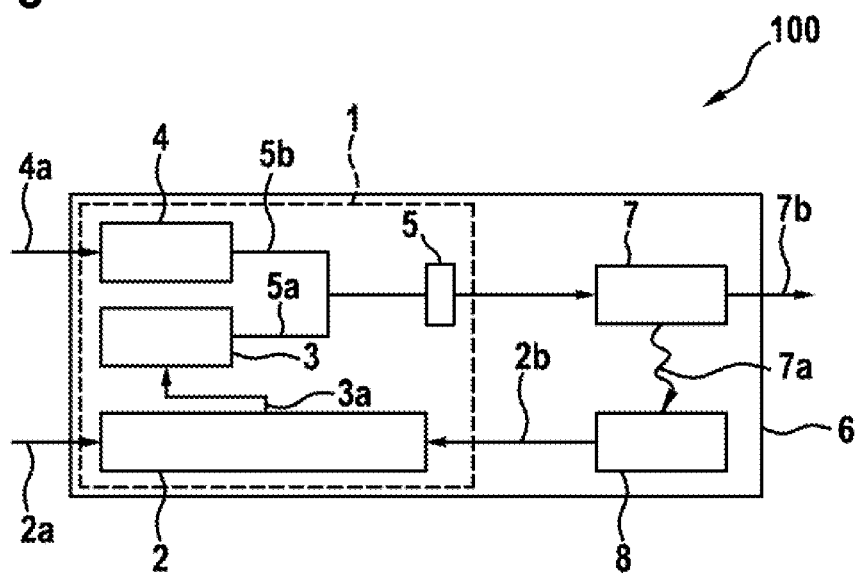
FIG. 2 shows a schematic representations of a laser projection system according to a further specific embodiment.

FIG. 2 shows a schematic representation of a laser projection system 100 that differs from the laser projection system 100 shown in FIG. 1 only in that actuation device 1 is developed in a shared casing together with laser diode 7 and photo diode 8. For example, laser diode 7, photo diode 8, and actuation device 1 may be manufactured together in one semiconductor structure.

Laser projection system 100, for example, may be used in an electronic device, such as, for example, a laptop, a smart phone, a mobile phone, a motor vehicle display unit (so-called "head-up-display," HUD), an image projector or another application device.

Figure 3:
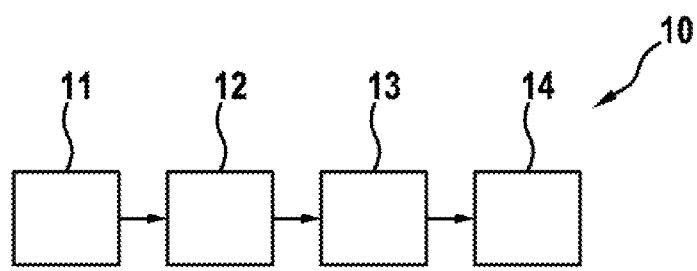
FIG. 3 shows a schematic representation of a method for speckle reduction in a laser diode according to a further specific embodiment.

FIG. 3 shows a schematic representation of a method 10 for speckle reduction in a laser diode, in particular in a laser diode 7 in a laser projection system 100, as represented in FIGS. 1 and 2. In a first step 11, method 10 includes the generation of a high-frequency modulated actuation signal 5a. Actuation signal 5a, for example, may be generated in that laser diode 7 is excited in multiple modes simultaneously or one after the other in short succession by actuation signal 5a. In a second step 12, high-frequency modulated actuation signal 5a operates laser diode 7. Here, high-frequency modulated actuation signal 5*a* serves to reduce speckles of the light 7*b* emitted by laser diode 7. In a third step 13, intensity 7*a* of the light emitted by laser diode 7 is detected, for example, in a photo diode 8, which may be situated in the same casing as laser diode 7. Finally, in a fourth step 14, high-frequency modulated actuation signal 5*a* is able to be regulated in order to adjust the degree of speckle reduction of laser diode 7. This may be done as a function of detected intensity 7*a*. The regulation may regulate high-frequency modulated actuation signal 5*a* in such a manner that the degree of speckle reduction reaches a specified setpoint. As explained previously, the specified setpoint may be set manually by a user, for example, or adjusted automatically by taking into account, for instance, the type of image data to be projected by laser diode 7 or the ambient brightness.

What is claimed is:

1. An actuation device for a laser diode, comprising:
   a first driver device configured to generate a high-frequency modulated actuation signal and to feed the high-frequency modulated actuation signal into the laser diode for speckle suppression; and
   an evaluation circuit coupled with the first driver device and configured to output to the first driver device (i) an intensity signal indicating the intensity of the light emitted by the laser diode, and (ii) a control signal as a function of the intensity signal, in order to regulate the high-frequency modulated actuation signal.

2. The actuation device as recited in claim 1, wherein the evaluation circuit (i) receives a setpoint signal for the degree of speckle suppression in the laser diode, and (ii) generates the control signal as a function of the setpoint signal.

3. The actuation device as recited in claim 2, further comprising:
   a second driver device configured to (i) receive an image data signal including image data to be projected by the laser diode, and (ii) generate a data control signal as a function of the image data signal, for actuating the laser diode.

4. The actuation device as recited in claim 3, wherein the evaluation circuit evaluates the intensity signal for determining a ratio between the intensity resulting from the high-frequency modulated actuation signal and the intensity of the light emitted by the laser diode resulting from the data control signal.

5. A laser projection system, comprising:
   a laser diode projecting image data;
   a photo diode detecting the intensity of light emitted by the laser diode; and
   an actuation device actuating the laser diode, the actuation device including:
      a first driver device configured to generate a high-frequency modulated actuation signal and to feed the high-frequency modulated actuation signal into the laser diode for speckle suppression; and
      an evaluation circuit coupled with the first driver device and configured to output to the first driver device (i) the intensity signal indicating the intensity of the light emitted by the laser diode, and (ii) a control signal as a function of the intensity signal, in order to regulate the high-frequency modulated actuation signal.

6. The laser projection system as recited in claim 5, wherein the laser projection system is part of an electronic application device which is one of a laptop, a smart phone, a mobile phone, a motor vehicle display unit and an image projector.

7. A method for speckle reduction in a laser diode, comprising:
   generating a high-frequency modulated actuation signal;
   operating the laser diode using the high-frequency modulated actuation signal for speckle reduction;
   detecting, by a photo diode, the intensity of light emitted by the laser diode; and
   regulating the high-frequency modulated actuation signal as a function of the detected intensity of light emitted by the laser diode, for adjusting the degree of speckle reduction.

\* \* \* \* \*